United States Patent [19]

Takahashi et al.

[11] Patent Number: 5,055,770

[45] Date of Patent: Oct. 8, 1991

[54] METHOD AND APPARATUS FOR DETECTING VOLTAGE

[75] Inventors: Hironori Takahashi; Shinichiro Aoshima; Yutaka Tsuchiya, all of Shizuoka, Japan

[73] Assignee: Hamamatsu Photonics K. K., Shizuoka, Japan

[21] Appl. No.: 507,514

[22] Filed: Apr. 11, 1990

[30] Foreign Application Priority Data

Apr. 12, 1989 [JP] Japan .................................. 1-92153

[51] Int. Cl.⁵ .......................................... G01R 23/16
[52] U.S. Cl. .................................. 324/96; 324/72.5; 324/77 K; 359/246; 359/252; 359/315
[58] Field of Search ............... 350/356, 388, 390, 396; 250/227.14, 227.17; 324/77 K, 32.5, 96

[56] References Cited

U.S. PATENT DOCUMENTS

| | | | |
|---|---|---|---|
| 3,827,000 | 7/1974 | Matsushita et al. | 350/388 |
| 3,832,033 | 8/1974 | Furuhata et al. | 350/388 |
| 4,269,483 | 5/1981 | Feldtkeller | 350/390 |
| 4,298,794 | 11/1981 | Snitzer et al. | 250/227.14 |
| 4,446,425 | 5/1984 | Valdmanis et al. | |
| 4,595,876 | 6/1986 | Kuhara et al. | 350/388 |
| 4,603,293 | 7/1986 | Mourou et al. | |
| 4,618,819 | 10/1986 | Mourou et al. | |
| 4,631,402 | 12/1986 | Nagatsuma et al. | 324/96 |
| 4,681,449 | 7/1987 | Bloom et al. | |
| 4,701,697 | 10/1987 | Lubbers et al. | 324/96 |
| 4,920,310 | 4/1990 | Aoshima et al. | 324/96 |
| 4,926,043 | 5/1990 | Solkner | 350/356 |

FOREIGN PATENT DOCUMENTS

| | | |
|---|---|---|
| 0160209 | 6/1985 | European Pat. Off. . |
| 0197196 | 10/1986 | European Pat. Off. . |
| 63-133068 | 6/1988 | Japan . |
| 63-308570 | 12/1988 | Japan . |
| 64-287424 | 11/1989 | Japan . |
| 2202639 | 9/1988 | United Kingdom . |

OTHER PUBLICATIONS

LLE Review, vol. 32, Jul.–Sep. 1987, pp. 158–163.
Valdmanis, Janis A. et al., "Subpicosecond Electrooptic Sampling: Principles and Applications", IEEE Journal of Quantum Electronics, vol. QE-22, No. 1, Jan. 1986, pp. 69–78.
Kolner, Brian H. et al., "Electrooptic Sampling In GaAs Integrated Circuits", IEEE Journal of Quantum Electronics, vol. QE-22, No. 1, Jan. 1986.

Primary Examiner—Kenneth A. Wieder
Assistant Examiner—William J. Burns
Attorney, Agent, or Firm—Finnegan, Henderson, Farabow, Garrett, and Dunner

[57] ABSTRACT

A voltage in a selected area of an object is measured by launching an input light beam into an electrooptic material whose refractive index is changed in accordance with an electric field created by the voltage in a selected area of an object to be measured, and detecting a change in polarization or in a deflection angle of an output light beam from the electrooptic material. A medium having a dielectric constant greater than the air is placed between the area to be measured and the electrooptic material.

12 Claims, 6 Drawing Sheets

METHOD AND APPARATUS FOR DETECTING VOLTAGE

BACKGROUND OF THE INVENTION

The present invention relates to a method and apparatus for detecting the voltage in a selected area of an object of interest by electrooptic conversion using an electrooptic material, the refractive index of which changes in response to the electric field created by said voltage. The present invention relates particularly to a method and apparatus capable of voltage detection with high time resolution and sensitivity.

Ultrafast transistors such as MODFETs (modulation doped field-effect transistors), superlattice photodetectors and high-speed integrated circuits operate on the picosecond order and techniques are available today by which the electric field (electric lines of force) originating from a voltage in a selected area of such ultrafast devices can be measured in a noncontact manner with picosecond time resolution and microvolt sensitivity. An example of these techniques is an electric field detecting apparatus that makes use of the Pockels effect and which detects the electric field in a selected area of an object of interest by electrooptic conversion with an electrooptic material, such as the crystal of $LiTaO_3$, the refractive index of which changes in response to said electric field. In this apparatus, the electrooptic material is placed between a polarizer and an analyzer having crossed directions of polarization, and the change in electric field is detected as the change in the amount of transmitted light.

There are two types of electric field detectors that make use of the Pockles effect, one being an "electrode" type in which an electrode on a plate-like electrooptic material is connected to the electrode on the object to be measured, and the other being a "probe" type characterized by easy access of the electrooptic material in probe form to a selected site of measurement. The first "electrode" type is described in U.S. Pat. Nos. 4,603,293 and 4,618,819, European Patent Application Unexamined Publication No. 197,196 and IEEE Journal of Quantum Electronics, Vol. QE-22, No. 1, January, 1986, pp. 69-78. The second "probe" type is described in CLEO, 1987, pp. 352-353, and LLE Review, Vol. 32, July-September, 1987, pp. 158-163.

The optical probe used in the latter system, which is to be brought into proximity with the site of measurement, is described in CLEO, 1987, pp. 352-353 and shown in FIG. 12 attached hereto. The probe generally indicated by 10 comprises a silica support 12 tipped with a $LiTaO_3$ crystal 14 in the form of a truncated four-sided pyramid, which in turn is provided on the bottom face with a full reflecting mirror 16 that is formed by evaporation of a multilayered dielectric film for reflecting a detecting light beam 18. An object to be measured 20, which is typically an integrated circuit, has a two-dimensional array of electrodes 22 and an electric field represented by electric lines of force is created on the surface of the circuit between adjacent electrodes 22. Hence, if the tip of the probe 10 is brought close to the object 20, the refractive index of the $LiTaO_3$ crystal 14 changes, causing the light beam 18 to be modulated. The modulation is converted to the change in the amount of transmitted light by means of a polarizer and an analyzer, whereby the electric field created between electrodes 22 on the object 20 is detected.

Another example of the optical probe 10 is described in LLE Review, Vol. 32, July-September, 1987, pp. 158-163 and shown in FIG. 13 attached hereto. A light beam 18 launched into a $LiTaO_3$ crystal 30 is reflected perfectly at three times by the surfaces so that it emerges from the crystal even without employment of a reflecting film on the underside of the crystal. In this modified version of probe 10, the refractive index of the crystal 30 is modulated by the electric field created parallel to the Z-axis in the vicinity of the bottom face of the crystal.

The $LiTaO_3$ crystal used as the electrooptic material in the conventional optical probes has a relative dielectric constant $\epsilon$ of 40 which is greater than that of the air. Therefore, if this crystal is brought close to the object 20, the electric field E created by electrodes 22 will be altered since it is determined by the equation $E = D/\epsilon$ (D is the electric flux density).

This phenomenon is explained as follows. In the case of a transverse modulator, if the $LiTaO_3$ crystal is absent, the object 20 will create an electric field as shown in FIG. 14. If the $LiTaO_3$ crystal 32 is placed into the electric field to be measured, the electric field will change as shown in FIG. 15, so that some equipotential lines will avoid the crystal 32. As a result, the electric field created in the crystal 32 becomes smaller than when the crystal is absent. In other words, less of the voltage created on the object 20 will be applied to the crystal 32. Therefore, the conventional optical probes using the $LiTaO_3$ crystal as an electrooptic material are incapable of efficient detection of the voltage on the object of interest and it has been difficult to enhance the sensitivity of voltage detection by these probes. The same problem has been encounted in a longitudinal modulator and the equipotential lines change in such a way that some of them avoid the crystal 32 as shown in FIG. 16.

SUMMARY OF THE INVENTION

The present invention has been accomplished in order to solve the aforementioned problem of the prior art. A first object of the present invention is to provide a method capable of detecting voltage with high sensitivity. A second object of the present invention is to provide an apparatus capable of detecting voltage with high sensitivity.

The first object of the present invention can be attained by a method that basically detects the voltage in a selected area of an object of interest by electrooptic conversion with an electrooptic material, the refractive index of which changes in response to the electric field created by said voltage. The method is characterized in that a medium having a greater dielectric constant than the air is placed between the area to be measured and a detecting portion that includes the electrooptic material and which is brought into proximity with said area to be measured.

The second object of the present invention can be attained by an apparatus that is equipped with an electrooptic material, the refractive index of which changes in response to the electric field created by the voltage in a selected area of the object to be measured, and which electrooptic material is brought into proximity with said selected area for detecting said voltage by electrooptic conversion. The apparatus is characterized in that a medium having a greater dielectric constant than the air is placed between the area to be measured and a detecting portion that includes the electrooptic material and which faces said area to be measured.

In one embodiment, the medium described above is not electrically conductive.

Said medium may be a soft solid material or a fluid material.

Said medium may be a combination of a soft solid membrane and a fluid material encapsulated therein.

The present inventors found that the conventional voltage detectors had low sensitivity not because the crystal of electrooptic material used had a high dielectric constant by itself, but because its dielectric constant differed by an excessive degree from the dielectric constant of the air present between said crystal and the object to be measured. Based on this finding, the present inventors placed a medium having a higher dielectric constant than the air between the detecting portion and the object to be measured, whereby the sensitivity of voltage detection was successfully enhanced.

DETAILED DESCRIPTION OF THE PREFERRED EMBODIMENTS

The preferred embodiments of the present invention are described below in detail with reference to the accompanying drawings.

To begin with, a first embodiment of the present invention is described with reference to the case of using a transverse modulator in which a light beam travels in a direction perpendicular to the direction of the electric field (perpendicular to equipotential lines) that is horizontal.

Figure 1:
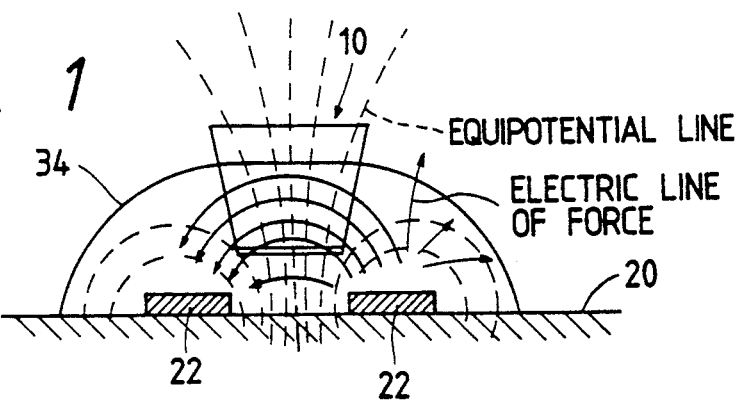
FIG. 1 is a cross section showing a first embodiment of the present invention.
Figure 15:
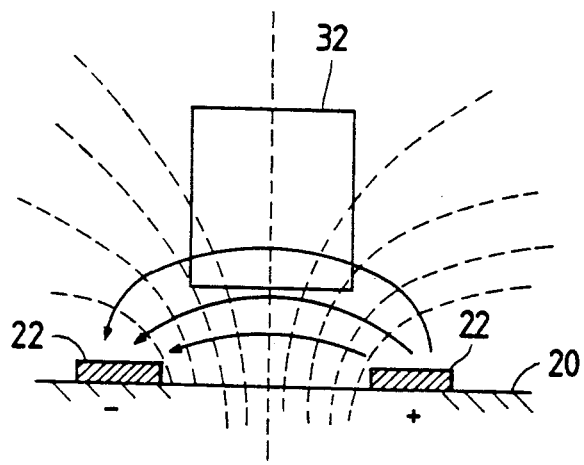

As shown in FIG. 1, the first embodiment is characterized in that a medium 34 having a greater dielectric constant than the air is placed between an optical probe (detecting portion) 10 comprising a LiTaO$_3$ crystal (electrooptic material) and an integrated circuit (object to be measured) 20. The existence of the medium 34 effectively reduces the difference in dielectric constant between the optical probe 10 and the gap between this probe and the integrated circuit 20, relieving remarkably the phenomenon that the necessary equipotential lines avoid the probe 10 as in the case shown in FIG. 15 which does not use the medium 34. As a consequence, the electric field created in the optical probe 10 can be sufficiently enhanced to provide an improved detection sensitivity.

Figure 2:
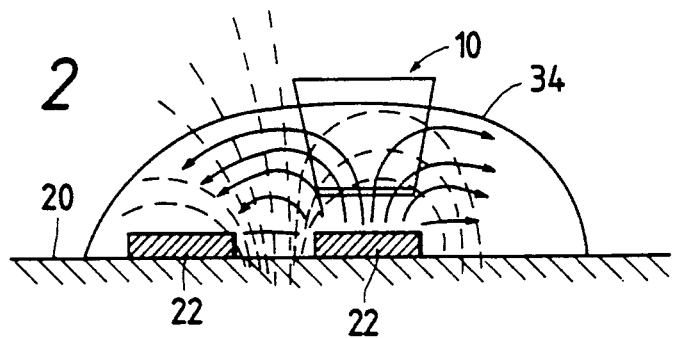
FIG. 2 is a cross section showing a second embodiment of the present invention.
Figure 16:
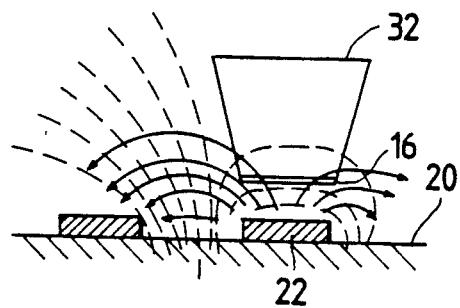
FIG. 16 is a diagram showing the change in electric field that occurs due to the presence of an electrooptic material of a longitudinal modulator.

In the next place, a second embodiment of the present invention is described with reference to FIG. 2 which shows the case of using a longitudinal modulator in which a light beam travels in a vertical direction parallel to the direction of the electric field. In this embodiment, too, a medium 34 having high dielectric constant is placed between the optical probe 10 and the object to be measured 20. Hence, as in the case of the transverse modulator described above, the phenomenon is effectively prevented that the necessary equipotential lines avoid the crystal 32, unlike in the case shown in FIG. 16 which does not use the medium 34. As a result, the sensitivity of voltage detection can be improved.

Figure 3:
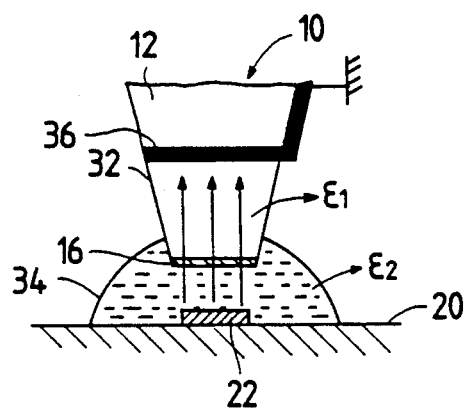
FIG. 3 is cross section showing a third embodiment of the present invention.

A third embodiment of the present invention is now described with reference to FIG. 3 which shows the case of using an optical probe 10 equipped with an auxiliary electrode.

In this embodiment, a transparent auxiliary electrode 36 is provided between a support 12 and a crystal 32. Even if the auxiliary electrode 36 is connected to the ground, the high dielectric constant medium 34 placed between the optical probe 10 and the object to be measured 20 effectively enhances the electric field created in the crystal 32 as compared to the case shown in FIG. 4 which does not use the medium 34, whereby a higher detection sensitivity can be achieved. The mechanism underlying this phenomenon is described below in detail with reference to FIGS. 3 and 4.

If is assumed that an electrode 22 on the object to be measured 20 (having a potential of V$_0$ volts) and tat the crystal 32 in the optical probe 10 (having a bottom surface potential of V volts) and the grounded auxiliary electrode combine together to form a parallel-plane capacitor, the voltage V across the crystal 32 is given by:

$$V = V_0[(\epsilon_2/d_2)/\{(\epsilon_1/d_1)+(\epsilon_2/d_2)\}]$$

where d$_1$ is the thickness of the crystal 32 in the probe 10; d$_2$ is the distance from the electrode 22 to the probe 10; $\epsilon_1$ is the relative dielectric constant of the crystal 32; and $\epsilon_2$ is the relative dielectric constant of the medium 34.

Figure 4:
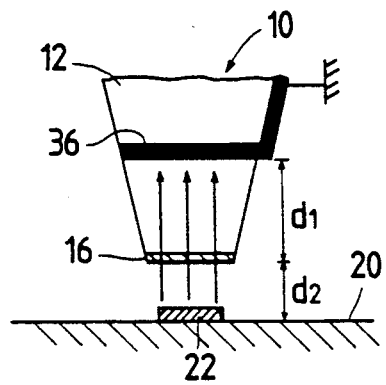
FIG. 4 is a cross section showing an arrangement corresponding to the third embodiment, which does not employ a medium having a high dielectric constant.

If d$_1$=50 μm, d$_2$=10 μm and V$_0$=10 volts, the voltage V across the crystal 32 of LiTaO$_3$ ($\epsilon_1$=40) in the case shown in FIG. 4 ($\epsilon_2$=1) is calculated to be 1.1 volts. If, on the other hand, pure water ($\epsilon_2$=80) is used as the high dielectric constant medium 34 as in the case shown in FIG. 3, V is calculated to be 9.1 volts. In other words, the electric field applied to the crystal 32 in the optical probe shown in FIG. 3 is at least 8 times as strong as the field applied in the case shown in FIG. 4, and the sensitivity of voltage detection is accordingly improved.

Any solid, liquid or gaseous material may be used as the medium 34 in the present invention as long as it has a greater dielectric constant than the air. The medium is preferably nonconductive, but it may be electrically conductive.

If a solid medium is to be used, it is preferably a soft material such as silicone, rubber ($\Box_r=3$) or a gel that readily experiences elastic deformation.

If desired, pure water, ethanol, glycerin or some other liquid material may be encapsulated with a membrane typically formed of a soft resin.

A liquid medium may be selected from among various materials such as pure water having a relative dielectric constant $\epsilon_r$ of 80, ethanol ($\epsilon_r=25$), glycerin ($\epsilon_r=42.5$), etc.

Figure 5:
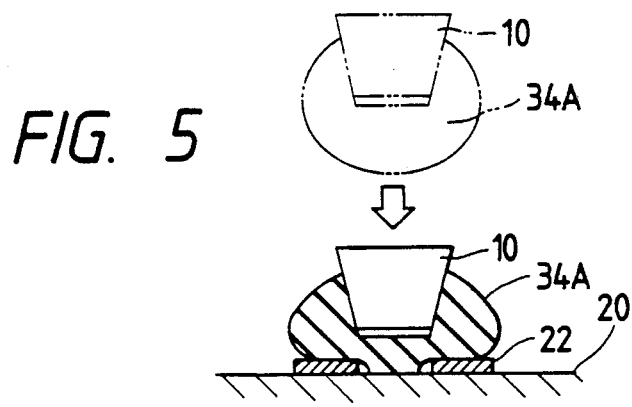
FIG. 5 is a cross section showing a fourth embodiment of the present invention.
Figure 6:
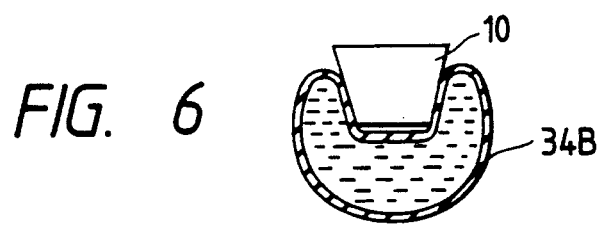
FIG. 6 is a cross section showing a fifth embodiment of the present invention.

A solid medium may be attached to the tip of the probe 10 as shown by 34A in FIG. 5. Alternatively, the capsule having a liquid medium confined in a membrane may be attached to the tip of the probe 10 as shown by 34B in FIG. 6. If there is a need to measure different areas of the object of interest 20, the medium may be moved together with the probe 10. In this case, the medium can safely be brought into contact with the object 20 without destroying either the object or the probe 10. Further, the medium 34 will not be consumed by repeated contact with the object 20.

If the medium is made of a liquid or gaseous material, the optical probe 10 held at constant height may be scanned over the object 20 for changing the site of measurement, and this enables the voltage to be measured in any position on the circuit. Since the system of the present invention has high detection sensitivity, the distance between the probe 10 and the object to be measured (circuit) can be sufficiently increased to eliminate the possibility that the object 20 is destroyed by contact with the probe.

In the present invention, the high dielectric constant medium 34 may be supplied to a predetermined position prior to measurement. Alternatively, it may be supplied as required for each measurement by means of a medium supply device which is described below.

Figure 7:
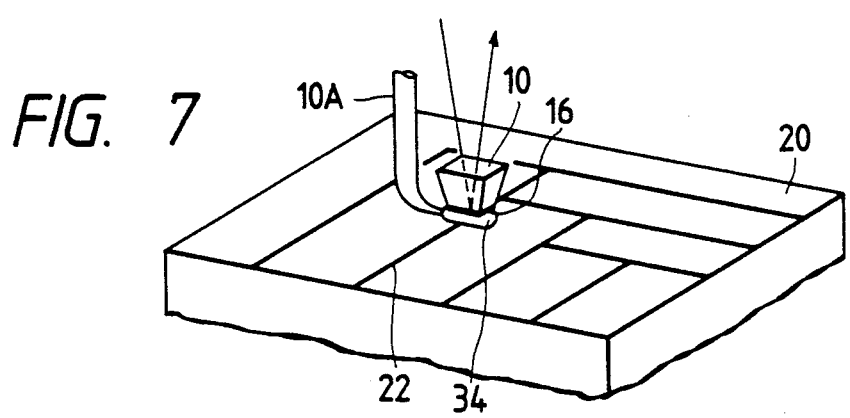
FIG. 7 is a perspective view showing how voltage is detected by the method of the present invention.

FIG. 7 is a perspective view showing schematically how the voltage on an integrated circuit (object to be measured 20) is detected by the method of the present invention using the optical probe (detecting portion) 10 described above.

If the detecting portion is solely composed of the optical probe 10, it is preferably of a comparable size to the electrode 22 on the object 20. A full reflecting mirror 16 is formed on the bottom face of the probe 10 and the high dielectric constant medium 34 is placed between the probe 10 and the object 20. If the medium 34 is a gaseous or liquid material, it is preferably supplied to the space between the probe 10 and the object 20 by means of a fluid medium supply device 10A installed in a support structure for the probe 10 as it becomes necessary for each measurement.

When this type of optical probe 10 is used as the detecting portion, since the medium 34 is used only in the necessary area, compared to the case to be described below which uses a tabular crystal, the detecting portion will cause less adverse effects on the operation of the integrated circuit (object to be measured) 20.

Figure 8:
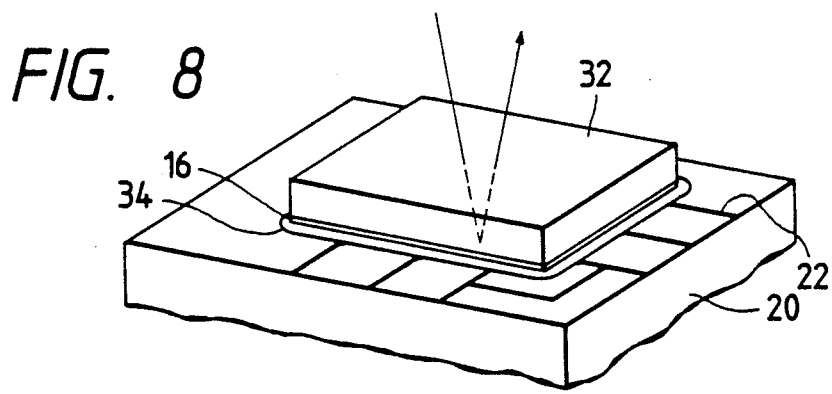
FIG. 8 is a cross section showing a sixth embodiment of the present invention.

FIG. 8 is a perspective view showing schematically an embodiment of voltage detection from an integrated circuit by means of a detecting portion that is composed of a tabular crystal 32. The tabular crystal 32 is large enough to cover a wide surface area of the integrated circuit and the high dielectric constant medium 34 is placed across the entire space between the crystal 32 and the object 20 in such a way that any irregularities in the surface of the object are filled with the medium.

This embodiment is suitable for the case where there is a need to detect the voltage on many electrodes 22 lying beneath the crystal 32 because the site of measurement can be readily changed by successively changing the position of illumination with a detecting light beam, with the crystal 32 held stationary.

Figure 9:
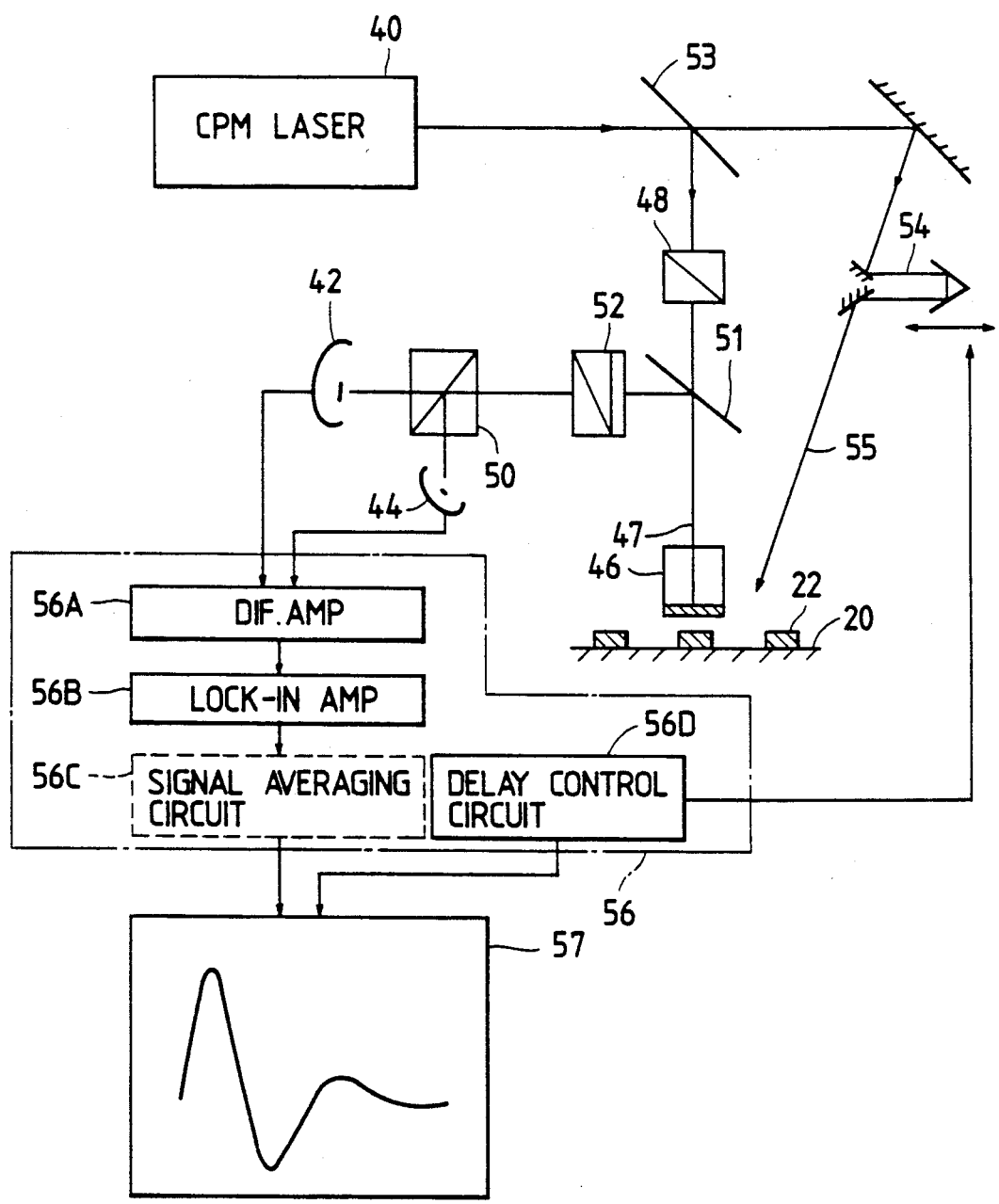
FIG. 9 is a block diagram showing the configuration of a first voltage detecting apparatus that employs the concept of the present invention.
Figure 10:
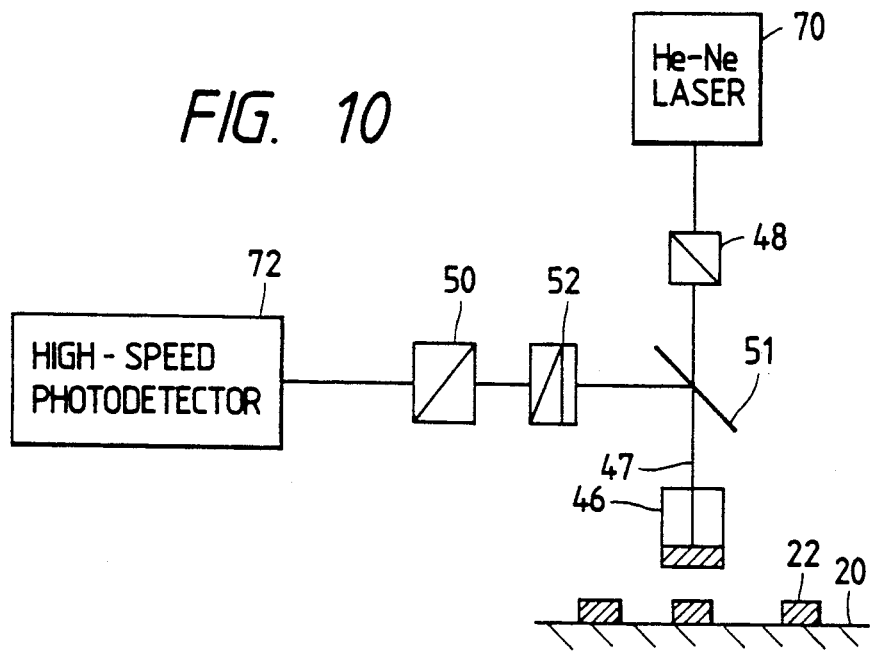
FIG. 10 is a block diagram showing the configuration of a second voltage detecting apparatus that employs the concept of the present invention.
Figure 11:
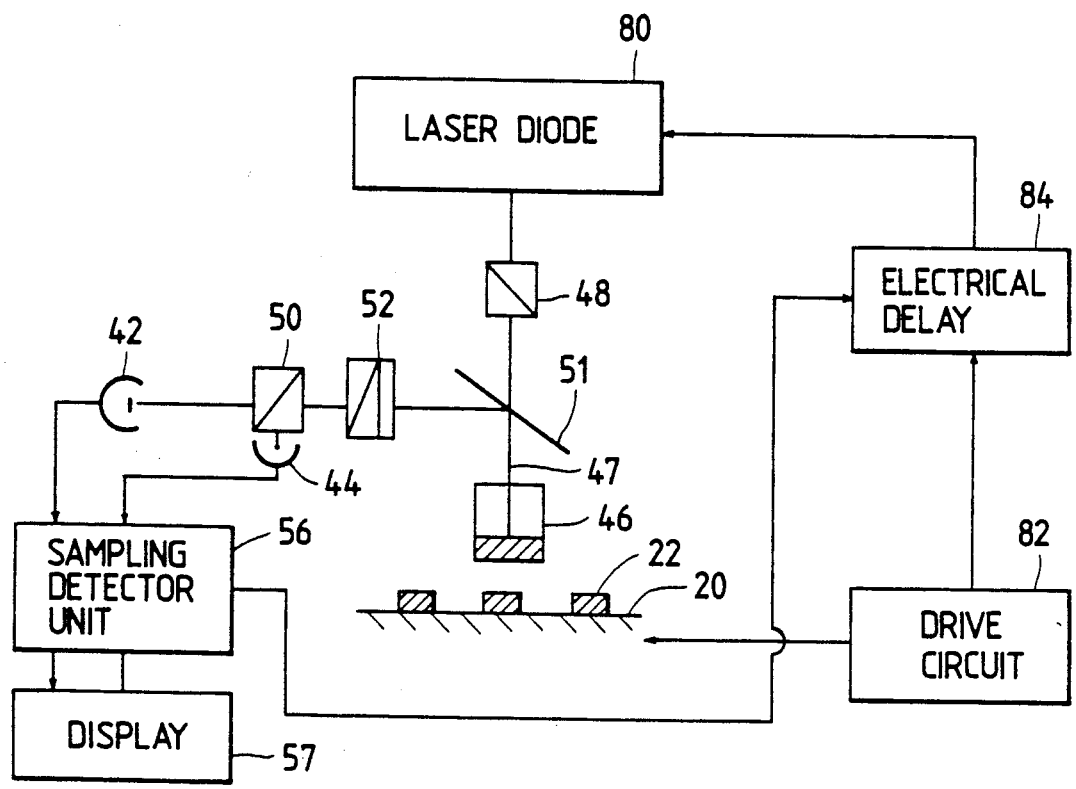
FIG. 11 is a block diagram showing the configuration of a third voltage detecting apparatus that employs the concept of the present invention.
Figure 12:
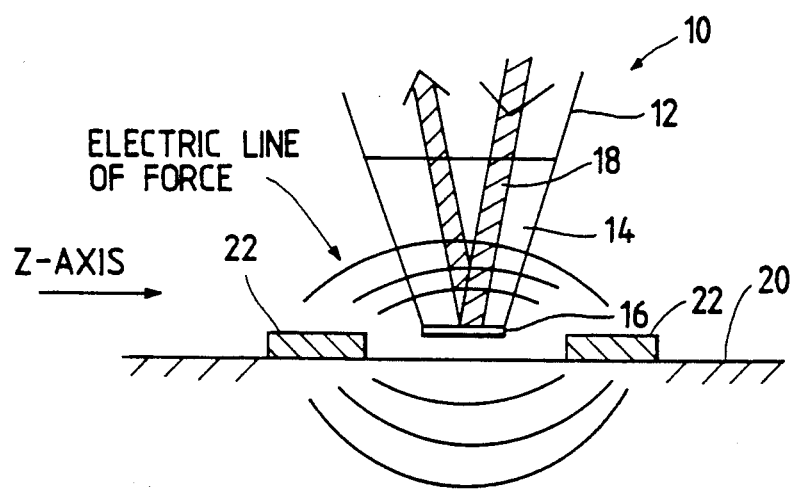
FIG. 12 is a cross section showing a prior art optical probe.
Figure 13:
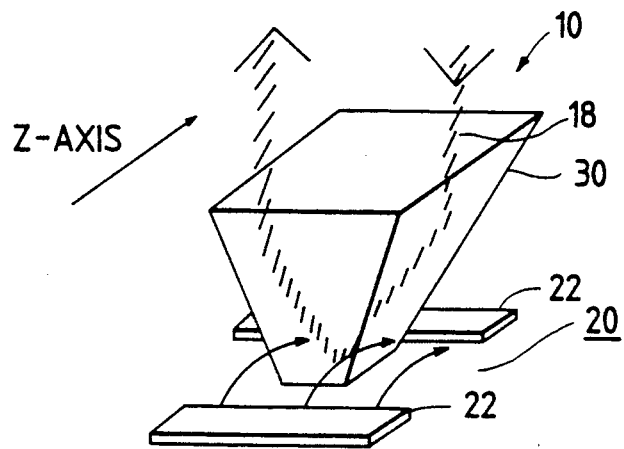
FIG. 13 is a cross section showing another prior art optical probe.
Figure 14:
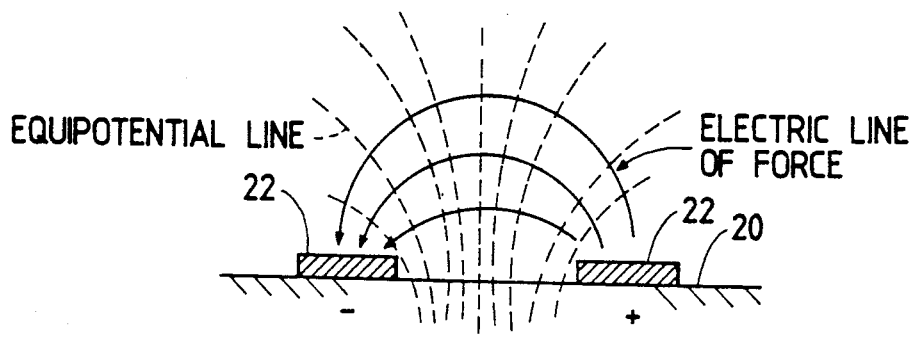
FIGS. 14 and 15 are diagrams showing how the electric field created by the object to be measured changes due to the presence of an electrooptic material of a transverse modulator.

Voltage detecting apparatus in which an optical probe adopting the concept of the present invention is used as a modulator that makes use of the Pockels effect are described below with reference to FIGS. 9-11.

A first voltage detecting apparatus that adopts the concept of the present invention makes use of an electrooptic sampling measurement. As shown in FIG. 9, this apparatus uses ultrashort pulses of light (e.g. 70 femtosecond pulses having a repetitive rate of 100 MHz) from a CPM laser 40 as a light source, and a pair of conventional photodiodes (e.g. PIN photodiodes) 42 and 44 as photodetectors.

The optical modulator is composed of an optical probe (which may be a tabular crystal) made of an electrooptic material as shown in FIG. 1, 2, 3, 5, 6, 7 or 8, a pair of polarizer 48 and analyzer 50, and an optical device such as a Soleil-Babiné compensator plate 52 for providing an optical bias.

The object to be measured 20 may incorporate a photodetector (not shown) which is excited by a trigger light beam 55 to drive the object 20. The trigger light beam 55 issues from the CPM laser 40, passes through a half-mirror 53 and is delayed, for scanning with a variable delay, by passage through an optical delay 54. As a consequence, the object 20 operates in synchronism with the CPM laser 40. In some cases, the object 20 need not incorporate a photodetector and the trigger light beam 55 may be used to illuminate the gap between the gate and the common electrode on the object 20 so that the gate is switched to the ground momentarily.

The light beam reflected by the half mirror 53 after issuing from the CPM laser 40 passes through a polarizer 48 that is set to have a polarizing angle of 45° with respect to the optic axis of the electrooptic material, and the probe light beam 47 emerging from the polarizer 48 is converged and launched into the optical probe 46.

The probe light 47 that has been modulated by the electric field in the probe 46 emerges therefrom and is reflected by a half mirror 51. The reflected light passes through the Soleil-Babiné compensator 52 where it is adjusted to have a bias corresponding to a quarter wavelength so that a linear response and a maximum voltage sensitivity can be attained, and the so-adjusted light is launched into the analyzer 50. The output light from the analyzer 50 is detected by the pair of photodiodes 42 and 44, and the detection signal is processed by a sampling detector unit 56 including a differential amplifier 56A, a lock-in amplifier 56B, an signal averaging circuit 56C which is optionally used to provide S/N improvement, and a delay control circuit 56D for controlling the optical delay 54. The output from the sampling detector 56 is graphed on a display (e.g. CRT) 57 as a waveform, with the delay (i.e., optical path difference) caused by the optical delay 54 being plotted on the horizontal axis whereas the detection signal is plotted on the vertical axis. Since the optical delay 54 operates in synchronism with the sampling detector 56, the CRT 57 provides a time vs. voltage display of an unknown electric signal. If desired, the signal averaging circuit 56C may be omitted from the circuit configuration described above.

A second example of voltage detecting apparatus that incorporates the concept of the present invention and which uses a high-speed photodetector adopting a streak camera technique is now described with reference to FIG. 10.

The optical modulator used in the second voltage detector is the same as what is used in the first voltage detecting apparatus described above. However, the light source is a continuous wave (CW) laser such as a He—Ne laser 70, and the photodetector is a high-speed photodetector 72 utilizing a streak camera technique. An example of the high-speed photodetector 72 is described in Japanese Patent Application Unexamined Publication No. 287424/1989. The other parts of the system and its operation are essentially the same as those of the first voltage detecting apparatus and will not be described in detail. The second voltage detecting apparatus has the advantage of simple configuration since it does not need an optical delay, a sampling detector unit and photodiodes.

A third example of the voltage detecting apparatus that incorporates the concept of the present invention and which employs a laser diode and an electrical delay is described below with reference to FIG. 11.

As in the second example, the optical modulator used in the third voltage detector is the same as what is used in the first example. However, the light source is a laser diode 80 which is driven by a drive circuit 82 in a pulsed manner and in synchronism with the operation of the object to be measured 20. An electrical delay 84 is provided between the drive circuit 82 and the laser diode 80 so that the drive timing of the object 20 and that of the laser diode 80 will be gradually shifted from each other.

The output light from the optical modulator is detected by photodetectors such as photodiodes 42 and 44, processed with a sampling detector unit 56 of the same type as used in the first example, and graphed as a waveform on a display 57. The electrical delay 84 operates in synchronism with the sampling detector unit 56. The other features of the third voltage detecting apparatus are the same as those of the first example and will not be described in detail.

The above description is devoted to the voltage detector which utilizes the change in polarization of a light beam due to the change in refractive index of an electrooptic material. However, it is noted that the present invention is not limited to such type of the voltage detector, but applicable to the type which utilizes the change in a deflection angle of a light beam caused by the change in refractive index of an electrooptic material. The voltage detector of the latter type is described in, for example, Japanese Patent Application Unexamined Publication No. 308570/1988.

As described on the foregoing pages, the apparatus of the present invention which detects the voltage in a selected area of an object of interest by making use of the Pockels effect has a medium of high dielectric constant placed between the object to be measured and an electrooptic material such as a LiTaO$_3$ crystal that is used in an optical probe. The use of said high dielectric constant medium contributes to efficient detection of the electric field, and hence the minimum detection limit can be improved. Further, the distance between the optical probe and the object of interest can be sufficiently increased to insure that the probe will not contact the object accidentally, which would otherwise result in the destruction of either device. Since the high dielectric constant medium can be made of a liquid or gaseous material, the optical probe can be scanned over the device of interest without causing any adverse effects on the latter.

What is claimed is:

1. In a method for measuring a voltage in a selected area of an object to be measured by launching an input light beam into an electrooptic material having a surface of a selected shape and whose refractive index is changed in accordance with an electric field created by the voltage to be measured, and detecting an output light beam from the electrooptic material, the improvement comprising the step of:
   placing an electrically non-conductive medium having a dielectric constant greater than the air between the area to be measured and the electrooptic material such that said medium flexibly conforms to the shape of said surface of the electrooptic material and flexibly conforms to the surface of the area to be measured.

2. The method according to claim 1, wherein the medium is a fluid medium, and wherein the method comprises the steps of:
   moving the detecting portion which includes the electrooptic material to a second measurement position above a second area of the object;
   placing the fluid medium between the second area and the electrooptic material; and
   measuring a voltage in the second area.

3. The method according to claim 1, wherein the electrooptic material is large enough to cover all of areas to be measured, and wherein the method further comprises the step of:
   scanning a plurality of positions in the electrooptic material with the input light beam, the plurality of positions corresponding to respective areas to be measured.

4. In an apparatus for measuring a voltage in a selected area of an object to be measured by launching an input light beam into an electrooptic material having a surface of a selected shape and whose refractive index is changed in accordance with an electric field created by the voltage to be measured, and detecting an output light beam from the electrooptic material, the improvement comprising:
   an electrically non-conductive medium having a dielectric constant greater than air placed between the area to be measured and the electrooptic material such that said medium flexibly conforms to the shape of said surface of the electrooptic material and flexibly conforms to the surface of the area to be measured.

5. The apparatus according to claim 4, wherein the medium is a soft solid material.

6. The apparatus according to claim 4, wherein the medium is a fluid material.

7. The apparatus according to claim 4, wherein the medium comprises a soft solid membrane and a fluid material encapsulated in the soft solid membrane.

8. The apparatus according to claim 6, further comprising means for supplying the fluid material so that the fluid material is placed between the area to be measured and the electrooptic material.

9. The apparatus according to claim 4, wherein the electrooptic material is large enough to cover all of areas to be measured, and wherein the apparatus further comprises means for scanning a plurality of positions in the electrooptic material with the input light beam, the plurality of positions corresponding to respective areas to be measured.

10. The apparatus according to claim 4, further comprising:

a pulse light source for emitting a pulse light beam to be launched into the electrooptic material as the input light beam; and means for detecting a waveform of a change in polarization of a pulse output light beam from the electrooptic material with sampling detection method.

11. The apparatus according to claim 4, further comprising:

means for converting the change in polarization of the output light beam from the electrooptic material into a change in intensity; and high-speed photodetecting means for converting the change in intensity of the output light beam into an electric signal.

12. The apparatus according to claim 11, wherein the high-speed photodetecting means is of a type employing a streak camera.

* * * * *